United States Patent
Podpora

(10) Patent No.: US 6,974,335 B1
(45) Date of Patent: Dec. 13, 2005

(54) INTERCHANGEABLE MULTI-FORM FACTOR MODULE SOCKET

(75) Inventor: Zenon A. Podpora, Pleasant Valley, NY (US)

(73) Assignee: International Business Machines Corporation, Armonk, NY (US)

(*) Notice: Subject to any disclaimer, the term of this patent is extended or adjusted under 35 U.S.C. 154(b) by 3 days.

(21) Appl. No.: 10/905,879

(22) Filed: Jan. 25, 2005

(51) Int. Cl.⁷ ................................................ H01R 9/09
(52) U.S. Cl. ........................................ 439/71; 439/331
(58) Field of Search ............................... 439/330, 331, 439/482, 68, 71–73; 324/754, 755; 361/704, 361/705, 767; 29/884, 825, 830, 846, 874

(56) References Cited

U.S. PATENT DOCUMENTS

| | | | | |
|---|---|---|---|---|
| 5,305,188 A | * | 4/1994 | Kubo | 361/787 |
| 5,518,410 A | | 5/1996 | Masami | |
| 5,713,744 A | | 2/1998 | Laub | |
| 5,748,007 A | * | 5/1998 | Gaschke | 324/755 |
| 5,841,640 A | | 11/1998 | Shibata | |
| 6,016,254 A | * | 1/2000 | Pfaff | 361/769 |
| 6,086,387 A | * | 7/2000 | Gallagher et al. | 439/71 |
| 6,097,609 A | | 8/2000 | Kabadi | |
| 6,204,681 B1 | * | 3/2001 | Nagatsuka et al. | 324/761 |
| 6,392,887 B1 | | 5/2002 | Day et al. | |
| 6,409,521 B1 | * | 6/2002 | Rathburn | 439/66 |
| 6,489,788 B2 | * | 12/2002 | Sausen | 324/754 |
| 6,492,826 B2 | * | 12/2002 | Hamren | 324/755 |
| 6,503,089 B2 | * | 1/2003 | Saijo et al. | 439/70 |
| 6,504,390 B2 | * | 1/2003 | Hamren | 324/755 |
| 6,585,535 B2 | | 7/2003 | Murr et al. | |
| 6,757,972 B1 | * | 7/2004 | Farnworth | 29/884 |
| 6,861,862 B1 | * | 3/2005 | Tate | 324/761 |
| 2004/0072456 A1 | | 4/2004 | Dozier, II et al. | |

OTHER PUBLICATIONS

Pending IBM application entitled "Electrostatic Discharge Dissipative Sockets", U.S. Appl. No. 10/710,679, filed Jul. 28, 2004.

* cited by examiner

*Primary Examiner*—Alexander Gilman
(74) *Attorney, Agent, or Firm*—Mark Bilak

(57) ABSTRACT

The present invention relates to interchangeable module sockets and socket assemblies for accommodating modules of different form factors.

20 Claims, 4 Drawing Sheets

INTERCHANGEABLE MULTI-FORM FACTOR MODULE SOCKET

BACKGROUND OF THE INVENTION

The present invention relates to module sockets and module socket assemblies for interfacing integrated circuits ("ICs") with electrical systems, and more particularly, to module sockets and module socket assemblies that provide an interchangeable interface to modules of different form factor types.

Module sockets and module socket assemblies adapted to receive ICs are used to provide both a mechanical and electrical interface between an IC and an electrical system. For example, the module socket or module socket assembly may serve as an interface between: an IC and a system board (e.g. a motherboard or daughter board), an IC and a test system (e.g. an electrical test system), or an IC and a burn-in test system (system for stressing ICs at elevated operating conditions). The IC may comprise one or more semiconductor chips that can be mounted on a module or printed circuit board.

Module sockets are designed to accommodate a particular module form factor and are customized to accommodate the device leads of the module, where device leads refer to the electrical input/output ("I/O") configuration of the module. Some exemplary module form factors include: pin-grid-arrays ("PGA"), land-grid-arrays ("LGA"), ball-grid-arrays ("BGA"), column-grid-arrays ("CGA") and the like. PGA form factors have device leads of the pin type. LGA form factors have device leads of the pad type. BGA form factors have device leads of the ball type. CGA form factors have device leads of the column type. PGA, LGA, BGA, and CGA device lead types are well known in the industry, and as such, no further description is warranted.

The module socket houses a plurality of electrical contacts for providing an electrical interface between the device leads of the module and the electrical contacts of the electrical system to which the IC is being interfaced. The socket conventionally has an alignment feature for properly positioning the module in the socket. The socket also conventionally has a section for housing electrical contacts and receiving the device leads of the module.

FIG. 1 illustrates an exemplary conventional BGA socket assembly 100. Socket assembly 100 comprises first pin housing die plate 110, second pin housing die plate 120, a plurality of compliant electrical contacts (e.g. pins) such as pin 130, system board 140, and alignment plate 150. BGA module 160 is received by alignment plate 150.

First and second pin housing die plates 110 and 120 have an array of openings for housing the plurality of pins. The openings in first pin housing die plate 110 are aligned with the openings in second pin housing die plate 120 such that the plurality of pins can be received by both die plates. Fasteners (not shown) such as screws can be inserted into multiple fastener openings to attach first pin housing die plate 110 to second pin housing die plate 120.

First pin housing die plate 110 and second pin housing die plate 120 contain (house) the plurality of pins such as pin 130. First pin housing die plate 110 and second pin housing die plate 120 are made from insulative materials to electrically insulate the pins. In addition to housing the pins, first pin housing die plate 110 and second pin housing die plate 120 provide mechanical alignment between the pins and the electrical contacts (e.g. pads) of system board 140.

The pins are made from conductive materials to electrically couple the system board 140 and the IC module 160. One terminal of the pins corresponds to the device leads of module 160 and the other terminal of the pins corresponds to the electrical pads of system board 140. For example, first terminal 162 of pin 130 is adapted to contact a ball-type device lead of module 160 and second terminal 164 of pin 130 is adapted to contact a pad-type device lead of system board 140.

Most conventional sockets comprise a stationary or floating alignment plate such as alignment plate 150 to mechanically align module 160 to the pin array that is housed in die plates 110 and 120. Alignment plate 150 is made from insulative materials to prevent electrical current flow between adjacent module or socket pins. Conventional BGA socket 100 can be used with BGA form factor modules only and cannot accommodate module device lead types other than balls.

FIG. 2 illustrates an exemplary conventional LGA socket assembly 200. Socket assembly 200 comprises first pin housing die plate 210, second pin housing die plate 220, a plurality of compliant pins such as pin 230, system board 240, and alignment plate 250. LGA module 260 is received by alignment plate 250.

First and second pin housing die plates 210 and 220 have an array of openings for housing the plurality of pins. The openings in first pin housing die plate 210 are aligned with the openings in second pin housing die plate 220 such that the plurality of pins can be received by both die plates. Fasteners (not shown) such as screws can be inserted into multiple fastener openings to attach first pin housing die plate 210 to second pin housing die plate 220.

First pin housing die plate 210 and second pin housing die plate 220 house the plurality of pins such as pin 230. First pin housing die plate 210 and second pin housing die plate 220 are made from insulative materials to electrically insulate the pins. In addition to housing the pins, first pin housing die plate 210 and second pin housing die plate 220 provide mechanical alignment between the pins and the pads of system board 240.

The pins are made from conductive materials to electrically couple the system board 240 and the IC module 260. One terminal of the pins corresponds to the device leads of module 260 and the other terminal of the pins corresponds to the electrical pads of system board 240. For example, first terminal 262 of pin 230 is adapted to contact a pad-type device lead of module 260 and second terminal 264 of pin 230 is adapted to contact a pad-type device lead of system board 240.

Conventional module sockets and module socket assemblies such as the kind illustrated in FIG. 1 and FIG. 2 provide only a single, non-interchangeable electrical interface to only one module form factor type. For example, conventional module sockets and module socket assemblies can accommodate only one form factor such as PGA, LGA, BGA, or CGA. Conventional module sockets and module socket assemblies are not interchangeable and cannot accommodate more than one module form factor type. Such non-interchangeable, single form factor sockets and socket assemblies are cost-prohibitive to the development, verification, and qualification of IC designs.

During IC development, verification, and qualification processes, the module to which a particular IC is mounted is often configured in more than one form factor type. For example, an IC may be mounted to a module where the module is of the LGA form factor type. During verification testing and/or qualification, the IC is often exposed to various test, verification, and stress equipment such as electrical test equipment, thermal cycle equipment, burn-in equipment, ESD equipment, and system verification equipment. At some point, the module to which the IC is mounted may change form factor, for example, from LGA to BGA by having solder balls attached to the pad array. Some stages of verification testing and/or qualification may require one type of form factor (e.g. LGA) while others such as system test and final test may require a different form factor (e.g. BGA).

Because conventional module sockets and module socket assemblies are non-interchangeable, and thus can only accommodate one module form factor type, multiple module sockets and module socket assemblies must be designed and procured in order to accommodate various module form factor types as the IC is subjected to development, verification, and qualification. Having to design and procure multiple module sockets and module socket assemblies is cost prohibitive. Additionally, requiring multiple module sockets and module socket assemblies for one IC design requires additional inventory. No satisfactory solution exists today for a module socket and module socket assembly that is capable of accommodating more than one module form factor type.

BRIEF SUMMARY OF THE INVENTION

The present invention addresses the above-described problems by providing an interchangeable module socket and socket assembly for use with modules of two different form factor types. In a first embodiment, an interchangeable module socket comprises an alignment plate, two pin housing die plates for housing pins, a plurality of protrusions formed on one of the die plates, and a plurality of cavities formed in the alignment plate, where the protrusions and cavities mate to accommodate a module of a first form factor type and do not mate to accommodate a module of a second form factor type.

In a second embodiment, an interchangeable module socket assembly comprises an alignment plate, two pin housing die plates for housing pins, a system board, a plurality of protrusions formed on one of the die plates, and a plurality of cavities formed in the alignment plate, where the protrusions and cavities mate to accommodate a module of a first form factor type and do not mate to accommodate a module of a second form factor type.

Additionally, an optional support frame can be inserted between the two die plates to add mechanical strength to the module socket and module socket assembly.

Furthermore, fasteners can be used to fasten the module socket to the system board or can be used to secure the module socket itself.

DETAILED DESCRIPTION OF PREFERRED EMBODIMENTS OF THE INVENTION

The present invention thus provides an interchangeable module socket and socket assembly for use with electrical systems that overcomes many of the disadvantages of the prior art. Specifically, the interchangeable module socket and socket assembly of the present invention can accommodate modules of different form factors. The interchangeable module socket and socket assembly of the present invention accommodates modules of different form factors by accommodating height differences associated with different device lead types. By accommodating such height differences, module sockets and module socket assemblies can be easily configured to accommodate different form factors by flipping over a portion of the assembly.

The invention will next be illustrated with reference to the figures in which the same numbers indicate the same elements in all figures. Such figures are intended to be illustrative, rather than limiting, and are included to facilitate the explanation of the process and device of the present invention.

Figure 1:
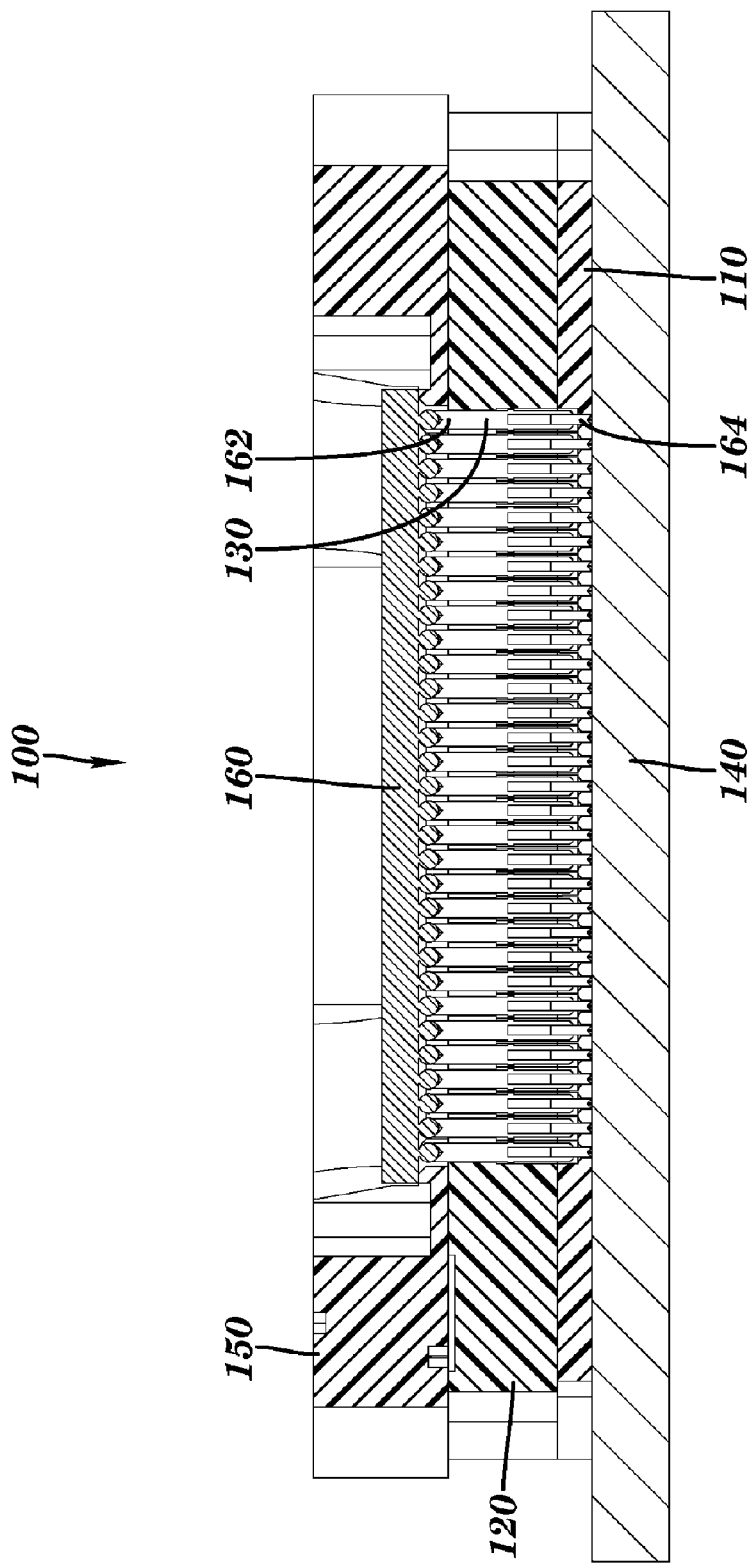
FIG. 1 is a partial cross-sectional view of a conventional non-interchangeable BGA module socket assembly.
Figure 2:
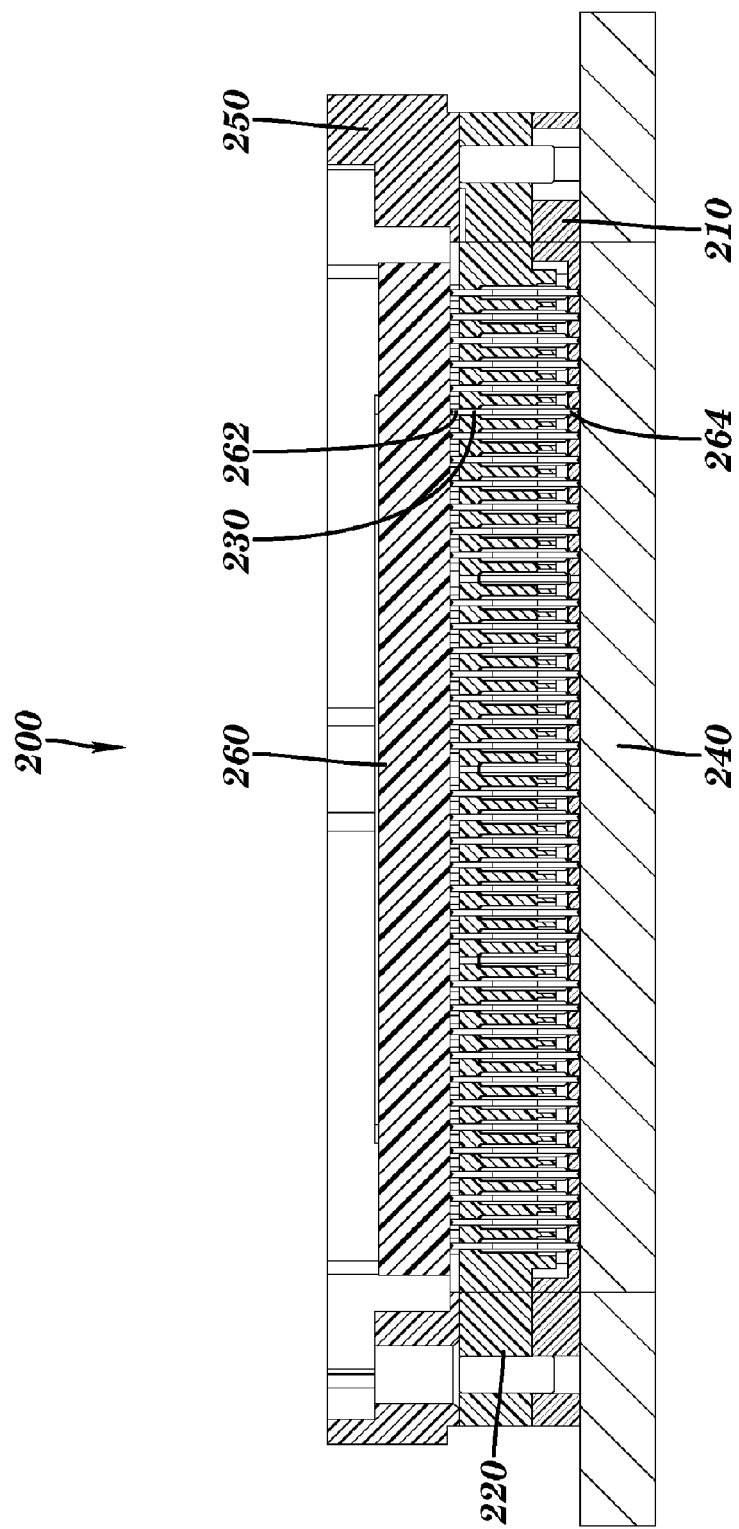
FIG. 2 is a partial cross-sectional view of a conventional non-interchangeable LGA module socket assembly.
Figure 3:
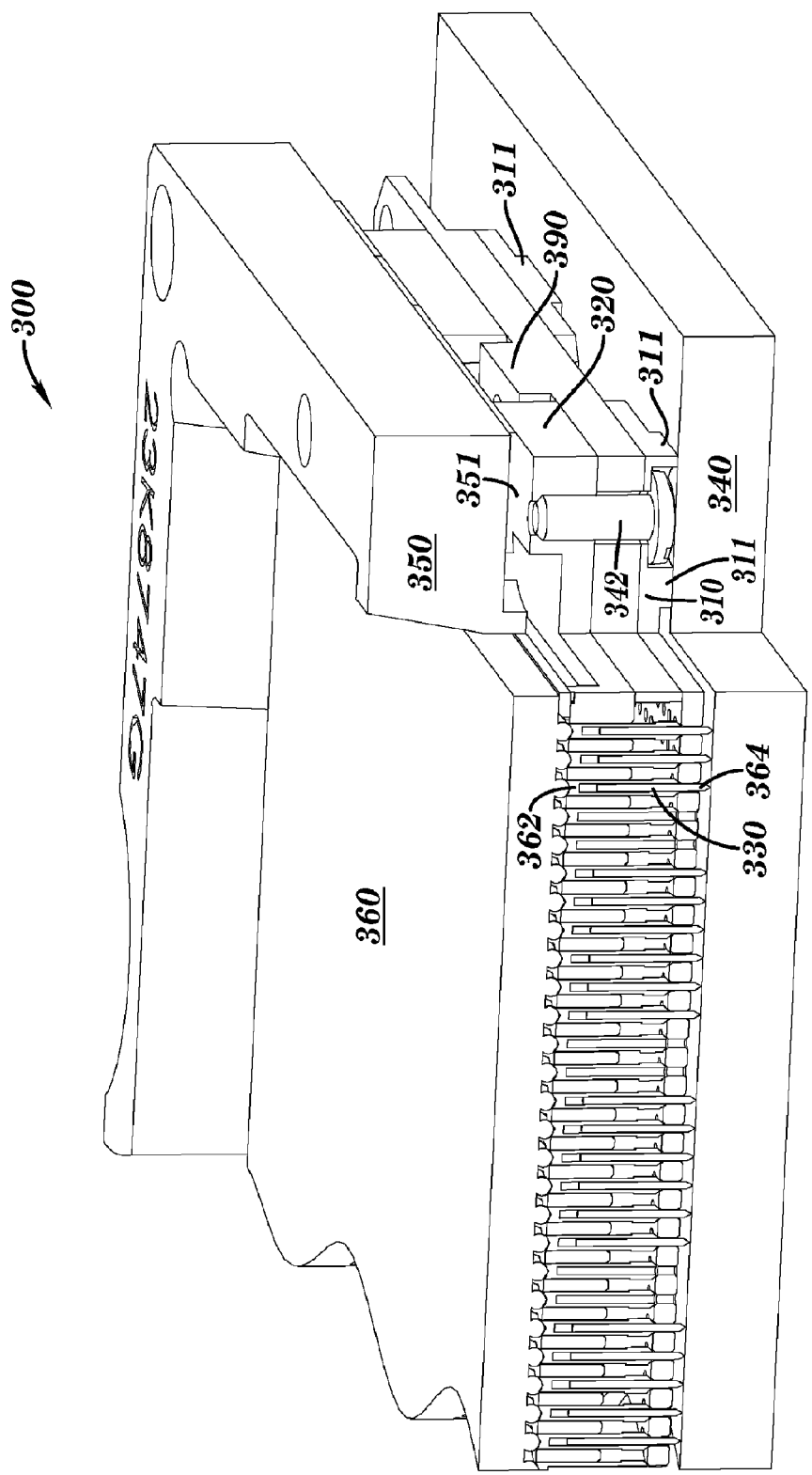
FIG. 3 is a partial cross-sectional view of an exemplary interchangeable module socket assembly according to an embodiment of the present invention configured to receive BGA modules.

FIG. 3 illustrates a partial cross-sectional view of an exemplary interchangeable module socket assembly 300 in accordance with an embodiment of the present invention configured to receive BGA modules. The interchangeable module socket assembly 300 comprises a module socket electrically coupled to system board 340. The module socket is formed from first pin housing die plate 310, second pin housing die plate 320, a plurality of electrical contacts (e.g. pins) such as pin 330, and alignment plate 350. System board 340 can be any suitable board adapted to provide an electrical interface between a module socket and an electronic system such as a computer, portable electronic device, wireless device, electronic test system, burn-in system, etc. For illustrative purposes only, system board 340 can be a printed circuit board such as a motherboard or daughterboard.

Pin housing die plates 310 and 320 each have a planar section and an edge section. A first surface of the planar and edge sections of plate 310 contacts a first surface of the planar and edge sections of plate 320. Both plates have an array of openings shaped to contain pins such as pin 330. The edge sections form a perimeter around the planar sections and provide a surface for fastening. In addition, plate 310 has a plurality of protrusions 311 that extend from a second surface of its edge section. Protrusions 311 provide height accommodation as described infra.

When plates 310 and 320 are in contact, the openings in plate 310 are aligned with the openings in plate 320 such that pins can be inserted into and housed within both die plates. Plate 310 and plate 320 contain (e.g. house) a plurality of pins such as pin 330. Plate 310 and plate 320 comprise insulative materials for electrically insulating the pins. In addition to housing the pins, plate 310 and plate 320 also provide mechanical alignment between the pins and the electrical contacts (not shown) of system board 340.

Alignment plate 350 provides both mechanical alignment of module 360 to the array of pins housed within plate 310 and plate 320 and also assists in compensating for module height differences. Alignment plate 350 comprises insulative materials for preventing electrical current flow between adjacent module device leads and/or adjacent socket pins.

Optionally, support frame 390 can be inserted between plate 310 and plate 320 to add mechanical strength to the module socket assembly. Support frame 390 can be made from any suitable material such as stainless steel and, in the exemplary embodiment, frame 390 can adapt the socket assembly to an existing socket frame (not shown). Fasteners, such as screw 342, can be inserted into one or more openings to attach plate 310, plate 320 and optional support frame 390 together.

To accommodate the height difference between two different module form factors, plate 310 has a plurality of protrusions such as protrusions 311 that correspond to a plurality of cavities such as cavity 351 formed in alignment plate 350. The protrusions and cavities are essential to the interchangeability feature of the module socket and socket assembly of the present invention. Without the protrusions and cavities, the height difference that exists between two different module form factors could not be accommodated. Without such height accommodation, a module inserted into the socket could not be properly contacted in both forms. Thus, without the protrusions and cavities, a module could only be properly contacted when configured as one form factor and not another.

Each protrusion extending from the edge section of plate 310 can mate with a cavity in the edge section of alignment plate 350 depending on the orientation of plate 310. For example, when module 360 is reconfigured from a BGA form factor to an LGA form factor, the protrusions and cavities compensate for the height difference attributable to the solder ball device leads of the BGA module. To accommodate two different module form factors such as LGA and BGA, the module socket must account for the difference in module device lead thickness between the two form factor types. The total module thickness is not the same for different form factors because the device leads associated with each form factor have different heights. For illustrative purposes only, if a BGA module has a total thickness of 0.150 inches and its device leads have a thickness of 0.020 inches (e.g. solder ball height), the overall thickness of the LGA module will be 0.130 inches (0.150 inches–0.020 inches). Thus, the module socket must account for the difference in device lead thickness because the socket pins must be compressed (i.e. deflected) by the same amount irregardless of the module form factor type for the socket to function properly. The module socket must account only for the difference in module device lead thickness and does not have to accommodate for module substrate thickness differences (e.g. ceramic substrate versus organic substrate).

To accommodate the height difference between two different device lead types, the protrusions and cavities can be of appropriate dimensions to account for the difference. As illustrated in FIG. 3, module 360 is of a BGA form factor. As such, the thickness of module 360 is greater than that of an LGA module because the solder ball device leads add to the total height of the module. To properly accommodate the height of module 360, alignment plate 350 is in contact with plate 320 and plate 310 is in contact with system board 340. Configured as such, the protrusions such as protrusions 311 cannot mate with the cavities such as cavity 351, thus accommodating for the height of the solder ball device leads. If module 360 were to be configured as an LGA form factor, the pin housing die plate assembly (die plates 310 and 320) would be flipped so that plate 310 would be in contact with alignment plate 350 and plate 320 would be in contact with system board 340. As such, the protrusions would mate with the cavities, thus accommodating for the reduction in height associated with pad-type device leads as compared to ball-type device leads.

Fasteners (not shown), such as screws, can be used to fasten the module socket to system board 340. Pins, such as pin 330 comprise conductive materials for electrically coupling system board 340 to the IC of module 360. One terminal of each pin corresponds to a first device lead type and the opposing terminal corresponds to the same or different device lead type. For example, terminal 362 of pin 330 contacts a ball-type device lead type and opposing terminal 364 contacts a pad-type device lead type. Preferably, at least one terminal of each pin has a crown tip. Crown tips are preferred for contacting device leads of the ball type. Either conical (e.g. single point) or crown tips can be used for contacting device leads of the pad type. For illustrative purposes only, the pins can be double-ended, single-ended, or spring loaded, such as those commercially offered by Everett Charles Technologies (e.g. Everett Charles Technologies model number SPC 080ZB pogo probes).

Figure 4:
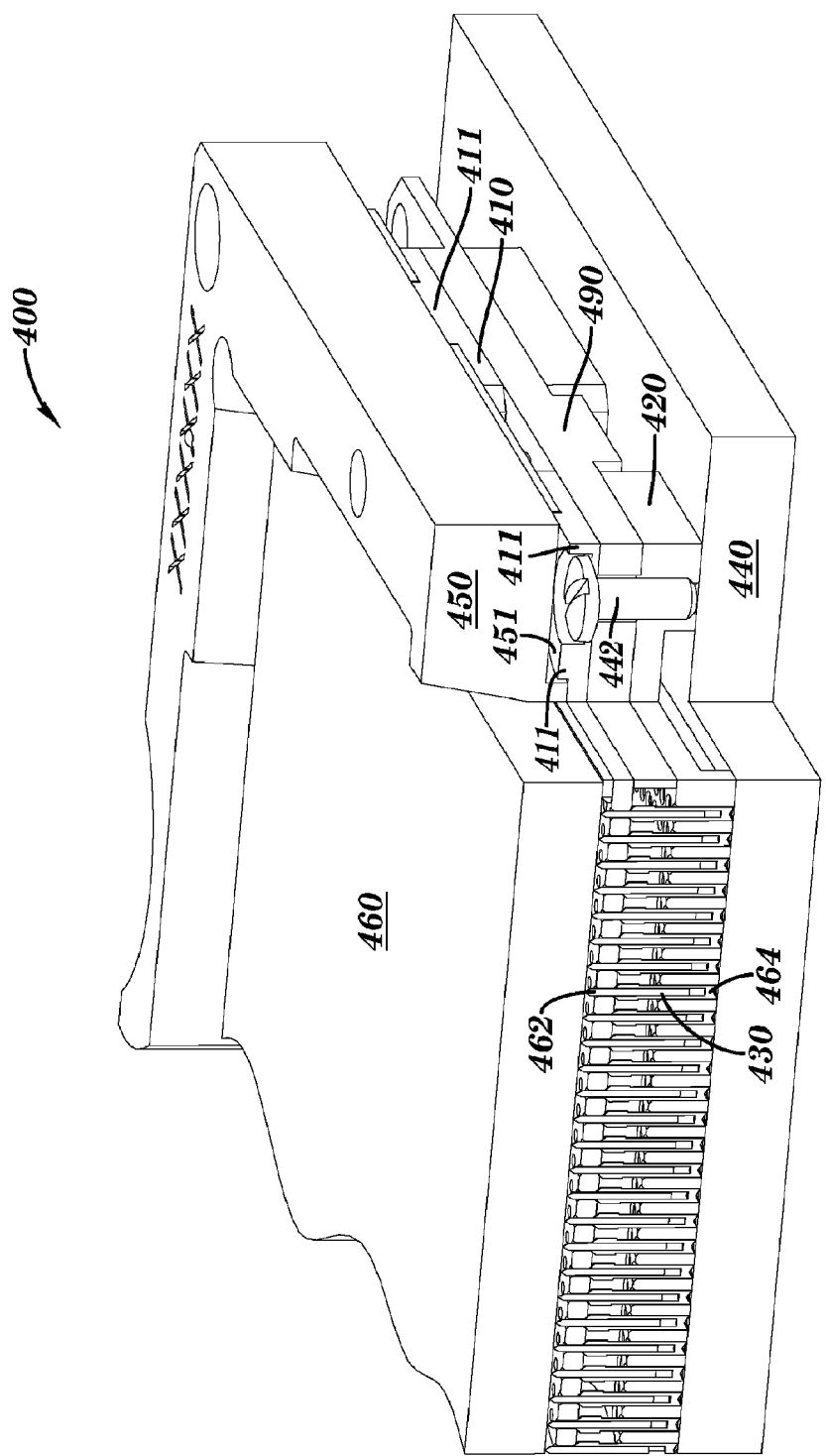
FIG. 4 is a partial cross-sectional view of an exemplary interchangeable module socket assembly according to an embodiment of the present invention configured to receive LGA modules.

FIG. 4 illustrates a partial cross-sectional view of the interchangeable module socket assembly illustrated in FIG. 3 configured to receive LGA modules. The interchangeable module socket assembly 400 is the same as assembly 300 of FIG. 3, except that the assembly is configured to receive LGA modules instead of BGA modules. Interchangeable module socket 400 is module socket assembly 300 of FIG. 3 except that the pin housing die plate assembly, comprising die plates 410 and 420, has been flipped as previously described to accommodate a module of the LGA form factor type. Module 460 is of the LGA form factor type and is contained within module socket assembly 400.

Optionally, support frame 490 can be inserted between plate 410 and plate 420 to add mechanical strength to the socket assembly as previously described. Fasteners, such as screw 442, can be inserted into multiple openings to attach plate 410, plate 420 and optional support frame 490 together.

To accommodate the height difference between two different device lead types, protrusions such as protrusions 411 and cavities such as cavity 451 can be of appropriate dimensions to account for the difference as previously described. As illustrated in FIG. 4, LGA module 460, having pad-type device leads, has an overall smaller thickness as compared to BGA module 360 of FIG. 3. To properly accommodate for the reduced height associated with LGA module 460, alignment plate 450 is in contact with plate 410 and plate 420 is in contact with system board 440. As such, the protrusions mate with the cavities, thus accommodating for the reduction in height associated with the pad-type device leads of module 460 as compared to ball-type device leads of BGA modules.

As illustrated in FIG. 4, protrusions such as protrusions 411 mate with cavities such as cavity 451 so that the total thickness of the module socket is reduced by an amount that corresponds to the change in height between the two different device lead types. Thus, by having the height of the protrusions and the depth of the cavities be of the appropriate dimension, the interchangeable module socket and socket assembly of the present invention can be configured to accommodate modules having two different form factors as previously described in accordance with FIG. 3. For example, the height of the protrusions formed on plate 410 and the depth of the cavities formed in alignment plate 450 should be at least equal to, if not greater than, the thickness of the ball-type device lead of module 360 of FIG. 3.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A module socket, comprising:
   a first member having a planar section and an edge section, the planar section having a plurality of openings and the edge section having a plurality of protrusions;
   a second member in contact with the first member, the second member having a planar section and an edge section, the planar section having a plurality of openings aligned with the plurality of openings in the first member;
   a plurality of electrical contacts positioned in the openings of the first and second members; and
   an alignment plate having a planar section and an edge section, the alignment plate being adapted to receive a module and the edge section having a plurality of cavities,
   wherein the alignment plate is in contact with the second member in accordance with the module being of a first form factor, the alignment plate is in contact with the first member in accordance with the module being of a second form factor, and the plurality of cavities mate with the plurality of protrusions when the alignment plate is in contact with the first member.

2. The module socket of claim 1, wherein the first member, the second member, and the alignment plate each comprise an insulative material.

3. The module socket of claim 1, further comprising a plurality of fasteners, each fastener being adapted to attach the first member to the second member.

4. The module socket of claim 1, wherein the first form factor is BGA and the second form factor is LGA.

5. The module socket of claim 4, wherein a height of each protrusion and a depth of each cavity is at least a thickness of a ball type device lead of the BGA form factor.

6. The module socket of claim 1, further comprising a support frame positioned between the first and second members, the support frame being adapted to provide mechanical strength to the module socket.

7. The module socket of claim 6, wherein the support frame comprises stainless steel.

8. The module socket of claim 1, wherein each of the plurality of electrical contacts has a first terminal adapted to contact a device lead of a first type and a second terminal adapted to contact a device lead of a second type.

9. The module socket of claim 8, wherein the first device lead is of the ball type and the second device lead is of the pad type.

10. The module socket of claim 9, wherein the first terminal comprises a crown tip and the second terminal comprises a tip selected from the group consisting of conical, single point, and crown.

11. A module socket assembly, comprising:
    a system board; and
    a module socket coupled to the system board, the module socket comprising:
    a first member having a planar section and an edge section, the planar section having a plurality of openings and the edge section having a plurality of protrusions;
    a second member in contact with the first member, the second member having a planar section and an edge section, the planar section having a plurality of openings aligned with the plurality of openings in the first member;
    a plurality of electrical contacts positioned in the openings of the first and second members; and
    an alignment plate having a planar section and an edge section, the alignment plate being adapted to receive a module and the edge section having a plurality of cavities,
    wherein the alignment plate is in contact with the second member and the system board is in contact with the first member in accordance with the module being of a first form factor, the alignment plate is in contact with the first member and the system board is in contact with the second member in accordance with the module being of a second form factor, and the plurality of cavities mate with the plurality of protrusions when the alignment plate is in contact with the first member.

12. The module socket assembly of claim 11, wherein the first member, the second member, and the alignment plate each comprise an insulative material.

13. The module socket assembly of claim 11, further comprising a plurality of fasteners, each fastener being adapted to attach the first member to the second member.

14. The module socket assembly of claim 11, wherein the first form factor is BGA and the second form factor is LGA.

15. The module socket assembly of claim 14, wherein a height of each protrusion and a depth of each cavity is at least a thickness of a ball type device lead of the BGA form factor.

16. The module socket assembly of claim 11, further comprising a support frame positioned between the first and second members, the support frame being adapted to provide mechanical strength to the module socket.

17. The module socket of claim 16, wherein the support frame comprises stainless steel.

18. The module socket assembly of claim 11, wherein each of the plurality of electrical contacts has a first terminal adapted to contact a device lead of a first type and a second terminal adapted to contact a device lead of a second type.

19. The module socket assembly of claim 18, wherein the first device lead is of the ball type and the second device lead is of the pad type.

20. The module socket assembly of claim 19, wherein the first terminal comprises a crown tip and the second terminal comprises a tip selected from the group consisting of conical, single point, and crown.

* * * * *